(12) United States Patent
Kim et al.

(10) Patent No.: US 6,452,826 B1
(45) Date of Patent: Sep. 17, 2002

(54) MEMORY MODULE SYSTEM

(75) Inventors: Se-Jin Kim; Sung-Ig Kang, both of Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/851,335

(22) Filed: May 9, 2001

(30) Foreign Application Priority Data

Oct. 26, 2000 (KR) ........................................ 2000-63185

(51) Int. Cl.$^7$ ................................................. G11C 5/06
(52) U.S. Cl. ........................................... 365/51; 365/63
(58) Field of Search .............................. 365/52, 51, 63, 365/230.03

(56) References Cited

U.S. PATENT DOCUMENTS

| | | | |
|---|---|---|---|
| 5,602,987 A | | 2/1997 | Harari et al. ................ 395/182 |
| 5,887,145 A | * | 3/1999 | Harari et al. ................ 395/282 |
| 5,889,654 A | | 3/1999 | Pierson et al. ............... 361/720 |
| 6,189,055 B1 | * | 2/2001 | Eisele et al. ................... 710/62 |
| 6,252,791 B1 | * | 6/2001 | Wallace et al. ................ 365/52 |
| 2001/0038547 A1 | * | 11/2001 | Jigour et al. ................... 365/43 |

FOREIGN PATENT DOCUMENTS

| | | |
|---|---|---|
| JP | 7200764 | 8/1995 |
| JP | 9114953 | 5/1997 |
| JP | 10144829 | 5/1998 |
| JP | 10340231 | 12/1998 |

* cited by examiner

*Primary Examiner*—Vu A. Le
(74) *Attorney, Agent, or Firm*—Lee & Sterba, P.C.

(57) ABSTRACT

A memory module system includes a plurality of memory integrated circuit fixtures, and a memory integrated circuit is attached on each of the memory integrated circuit fixtures by forced contact method. The attached memory integrated circuit can be removed from a corresponding memory integrated circuit fixture. Memory size of memory module systems can be increased, and defective memory integrated circuits can be replaced easily by users.

6 Claims, 3 Drawing Sheets

MEMORY MODULE SYSTEM

BACKGROUND OF THE INVENTION

1. Field of the Invention

The present invention relates to storage device and, more particularly, to a memory module system which can increase storage size and replace defective integrated circuits.

2. Description of Background Art

In memory devices for storing data, portable memory device has been manufactured by module type. Music data converted to digital data, document data, and photograph data are stored in memory device of module type. Semiconductor memory integrated circuit has been used for this kind of data storage. The problem with this memory device is as follows.

It is impossible for user to increase memory size in the module type memory device. If the user tries to increase memory size in the module type memory device, he/she should purchase new module having memory size he/she wants. Also, several modules are needed to store large size data. If at least one of integrated circuits provided in the module has defect, it is impossible to use remaining normal integrated circuits. In such case, it is also impossible for user to replace only the defective integrated circuit.

Consequently, there is a need for a new conceptual memory device for which the user can increase the size of data, and replace data more easily.

SUMMARY OF THE INVENTION

According to a feature of an embodiment of the present invention, there is provided a memory module system capable of increasing data size and replacing defective integrated circuit.

According to an aspect of an embodiment of the present invention, a memory module system is provided which includes a memory controller, a plurality of memory integrated circuit fixtures formed on printed circuit board with open and shut tops. A storage device is attached on the memory integrated circuit fixtures by forced contact method, and then the fixture top is shut. The attached storage device can be removed easily from the memory integrated circuit fixtures by opening the top. The storage device attached on the memory integrated circuit fixtures is connected to the memory controller to be selected individually, and to share data, address and control signal.

According to another aspect of an embodiment of the present invention, the memory module system includes a wire/wireless interface, a battery, and a liquid display. The memory controller communicates with an external device through the wire/wireless interface, the battery supplies power to the memory module system internally, and the liquid display is used to notify internal operation of the system to the user.

According to another aspect of an embodiment of the present invention, the memory controller includes an algorithm which can automatically detect the size of storage device attached to the corresponding memory integrated circuit fixtures. The detecting algorithm includes generating an address for designating initial data storage location on power-on or initialization, writing data into the storage device in response to the address, reading the written data, comparing the written data with the read data, increasing the address to designate next data storage location, when the written data and the read data are identical, and performing repeatedly the writing, reading, comparing and increasing until the written data is not read.

According to the memory module system of the present invention, not only can the memory size of memory module system be increased, but also defective memory integrated circuits can be replaced easily by users.

DETAILED DESCRIPTION OF THE INVENTION

Korean Patent Application No. 00-63185 filed Oct. 26, 2000, entitled "Memory Card System," is incorporated herein by reference in its entirety.

The present invention will now be described more fully hereinafter with reference to the accompanying drawings, in which preferred embodiments of the invention are shown. This invention may, however, be modified in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
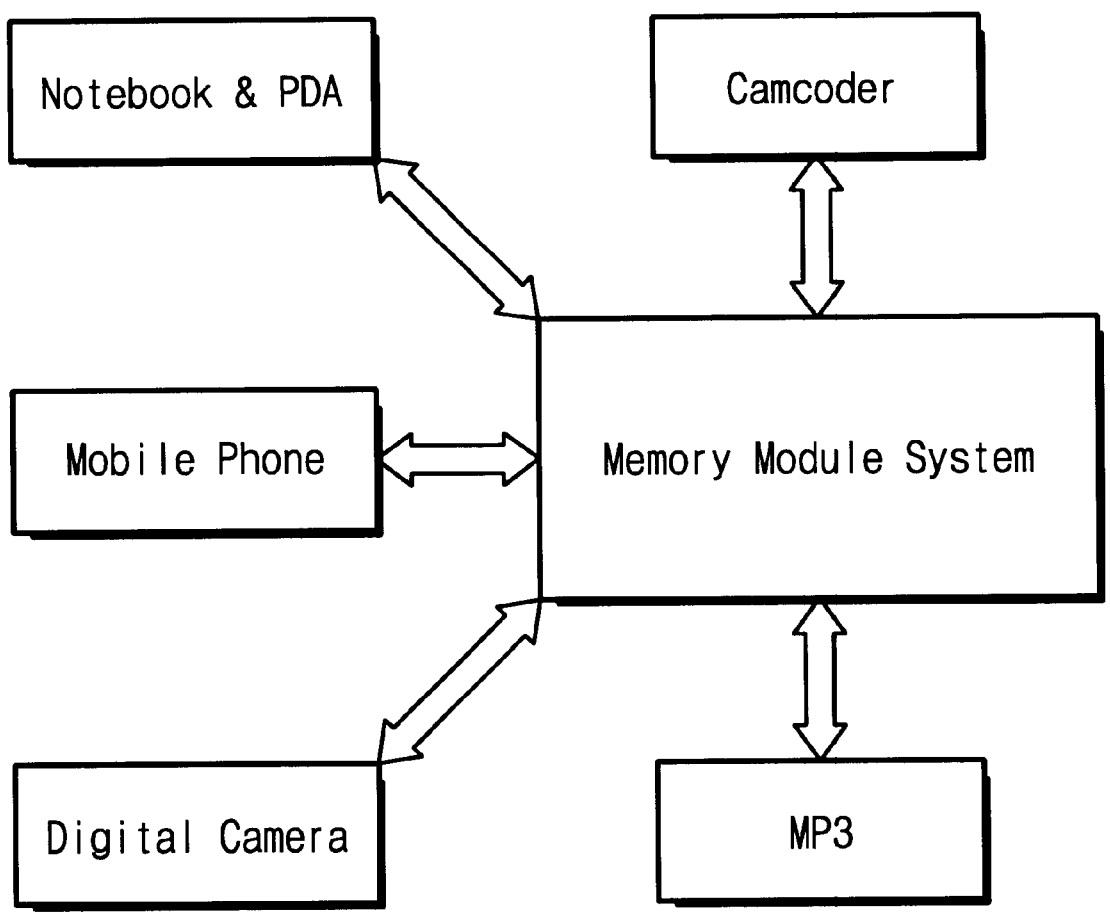
FIG. 1 is a block diagram illustrating a memory module system according to an embodiment of the present invention, and a portable system including the memory module system.

FIG. 1 is a block diagram of a portable memory module system according to an embodiment of the present invention. The storage size provided by the memory module system according to the present invention can be expanded, and semiconductor memory integrated circuit provided in the memory module system also can be replaceable. This will be explained in more detail later. As seen from FIG. 1, the memory module system according to the present invention can be used as a device storing back-up data of digital camera or digital video camera, or temporal data. Also, the memory module system according to the present invention can be used instead of a hard disc driver of notebook system or a PDA system, and can be used as expansion system for storing back-up data of smart phone or MP3 system. Furthermore, the memory module system according to the present invention is connectable to the portable systems explained above by wire or wireless, and can be used effectively.

Figure 2:
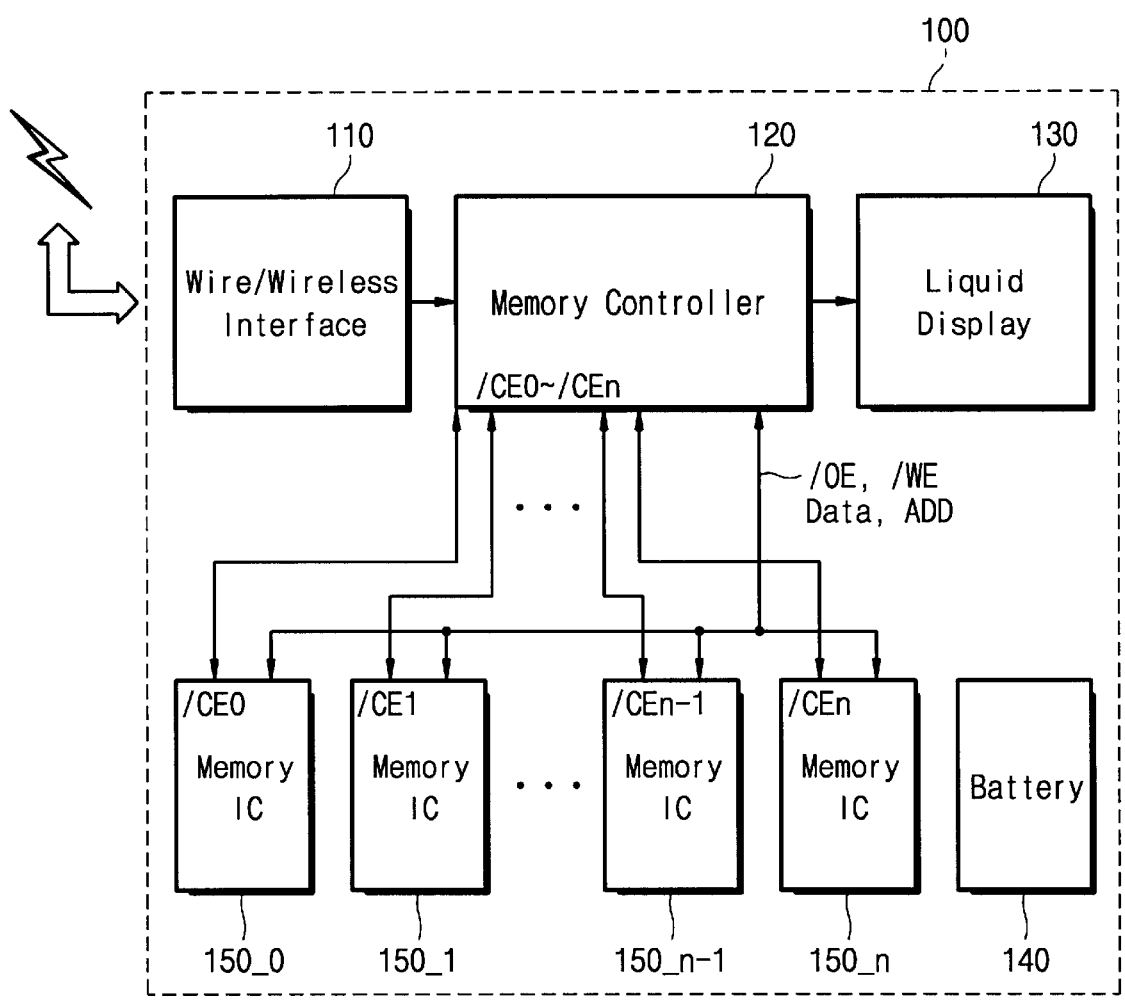
FIG. 2 is a block diagram illustrating another embodiment of memory module system according to the present invention.
Figure 3:
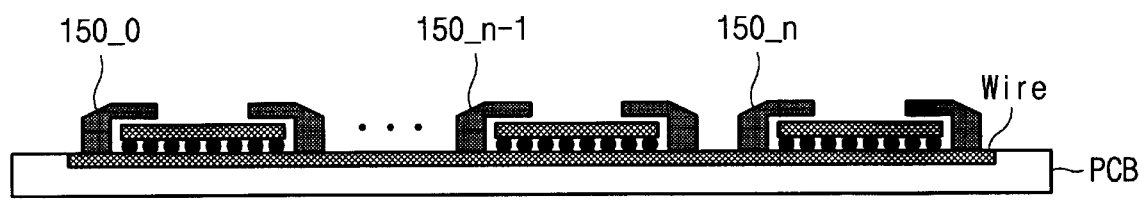
FIG. 3 illustrates a cross-sectional view of the structure of memory integrated circuit fixture shown in FIG. 2.
Figure 3:
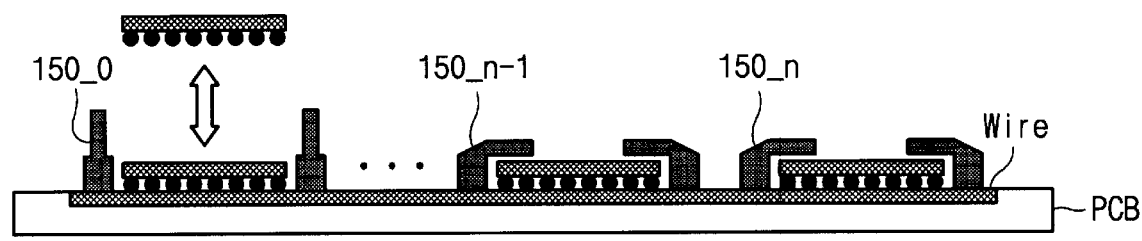

FIG. 2 is a block diagram illustrating an embodiment of memory module system according to the present invention, and FIG. 3 shows a cross-sectional view of the structure of memory integrated circuit fixture according to FIG. 2. Referring to FIG. 2, the memory module system (100) of present invention includes a wire/wireless interface (110), a memory controller (120), a liquid display (130), a battery (140), and a plurality of memory integrated circuit fixtures (150_0~150_n). A memory integrated circuit mounted on the respective memory integrated circuit fixtures (150_0~150_n) is a unit for storing data, and is in a of plastic or CSP package. Also, the memory integrated circuit mounted on the respective memory integrated circuit fixtures (150_0~150_n) can be made in the form of a small module which contains only unit integrated circuit of micro smart media module or package of unit memory chip.

Memory integrated circuits mounted on the respective fixtures (150_0~150_n) are selected individually in response to corresponding chip selection signals (/CE0~/CEn) generated from the memory controller (120). The memory integrated circuits mounted on the respective fixtures (150_0~150_n) are configured to share control signals (/OE,/WE), data signals, and address signals through bus connected to the memory controller (120). The method of mounting memory integrated circuits on the corresponding fixtures (150_0~150_n) is not a soldering method but a forced contact method.

If a mounted memory integrated circuit happens to be defected, the memory controller (120) identifies the location of the defective memory integrated circuit, and notifies the user through the liquid display (130). As depicted in FIG. 3, the memory integrated circuit fixtures (150_0~150_n) are configured to operate in an open and a shut mode in order to change and hold the memory integrated circuits, respectively. The memory integrated circuit fixtures are formed on the metal lines of the printed circuit board.

The memory controller (120) performs basically overall control operation. It's functions include monitoring data status of added memory integrated circuit, correcting error in defective bit, and improving reliability of stored data and file management. Furthermore, the memory controller (120) has a function of protecting previously stored data against undesired data access and writing from the exterior. The memory controller (120) can receive/transmit data from/to exterior through the wire/wireless interface (110).

The memory module system according to the present invention also generates a warning signal such as sound and vibration when there is access from exterior. Such an access can be allowed by the certification of user of the memory module system. Using switch in the module system or password can be employed to protect the data of the original user and as a method of certification for external access. As these certification methods are obvious to those who skilled in this art, the detail explanation will be omitted herein for simplicity.

The memory controller (120) according to the present invention provides an algorithm which can automatically detect the size of an attached memory integrated circuit. According to this algorithm, the memory controller (120) writes data into the attached memory integrated circuit by utilizing an address for storage location, when power is supplied to the system or the system is initialized. Next, the memory controller (120) reads the written data, and compares the read data with the written data. If the written data is identical to the read data, the memory controller (120) increases the address to designate the next storage location. By using increased addresses, data is written into the attached memory integrated circuit. This procedure is performed repeatedly until previously written data is not read. Calculating the address generated, the size of an attached memory integrated circuit can be finally identified.

As described above, by providing an attached memory integrated circuit fixture in a memory module system, the storage size of memory module system can be easily increased by a user and defective memory integrated circuits can be replaced easily by a user.

The foregoing description of the present invention has been presented, using specific terms, for purposes of illustration and description. Numerous modifications and variations of the present invention are possible in light of the above teachings. It is therefore to be understood that, within the scope of the appended claims, the present invention can be practiced in a manner other than as specifically described herein.

What is claimed is:

1. A memory module system comprising:
    a memory controller(120); and
    a plurality of memory integrated circuit fixtures(150_0~150_n) formed on printed circuit board with opening and shutting mounted tops,
    wherein an integrated circuit storage device is removeably attached to each one of the memory integrated circuit fixtures, and the integrated circuit storage device mounted on the memory integrated circuit fixtures is connected to the memory controller to be selected individually, and to share data, address, and control signals.

2. The memory module system of claim 1, wherein the storage device is attached on the corresponding memory integrated circuit fixtures by forced contact method.

3. The memory module system of claim 1, further comprising a wire/wireless interface, wherein the memory controller communicates with an external device by either a wire or a wireless method through the wire/wireless interface.

4. The memory module system of claim 1, further comprising:
    a battery for supplying power to the memory module system internally; and
    a liquid display for notifying the user of internal operations of the system.

5. The memory module system of claim 1, wherein the memory controller includes an algorithm which can automatically detect a size of a storage device attached to the corresponding memory integrated circuit fixtures.

6. A method of detecting algorithm of the memory controller of claim 5, comprising:
    generating an address for designating initial data storage location on power-on or initialization;
    writing data into the storage device in response to the address;
    reading the written data;
    comparing the written data with the read data;
    increasing the address to designate next data storage location, when the written data and the read data are identical; and
    performing repeatedly the writing, reading, comparing and increasing until the written data is not read.

* * * * *